(12) United States Patent
Chen et al.

(10) Patent No.: US 7,967,577 B2
(45) Date of Patent: Jun. 28, 2011

(54) FAN ASSEMBLY AND FASTENING STRUCTURE THEREOF

(75) Inventors: Chin-Ming Chen, Taoyuan Hsien (TW); Yu-Hsien Lin, Taoyuan Hsien (TW); Cheng-Chih Lee, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 1006 days.

(21) Appl. No.: 11/708,317

(22) Filed: Feb. 21, 2007

(65) Prior Publication Data

US 2007/0268665 A1 Nov. 22, 2007

(30) Foreign Application Priority Data

May 22, 2006 (TW) ................................ 95118123 A

(51) Int. Cl.
*F04B 17/03* (2006.01)
*H05K 7/20* (2006.01)

(52) U.S. Cl. ..................... 417/360; 417/423.15; 361/695
(58) Field of Classification Search .................. 417/360, 417/423.15; 361/695
See application file for complete search history.

(56) References Cited

U.S. PATENT DOCUMENTS

| 4,964,787 | A | * | 10/1990 | Hoover ........................... 417/363 |
| 5,924,849 | A | * | 7/1999 | Kirchgessner et al. .. 417/423.15 |
| 6,183,214 | B1 | * | 2/2001 | Ko ................................. 417/360 |

* cited by examiner

*Primary Examiner* — Charles G Freay
(74) *Attorney, Agent, or Firm* — Birch, Stewart, Kolasch & Birch, LLP

(57) ABSTRACT

A fastening structure for a fan has a frame which includes a fastening member having a vertical portion fixed to the frame, and an extending portion extending towards the interior of the frame and having a protrusion, where when the fan is assembled with the fastening structure, the fan is rotated along an axle thereof to closely fit the protrusion in an hole of the outer frame of the fan so that the fan can be fixed on the frame.

19 Claims, 6 Drawing Sheets

FAN ASSEMBLY AND FASTENING STRUCTURE THEREOF

BACKGROUND OF THE INVENTION

1. Field of the Invention

The invention relates to a fastening structure, and specifically, to a fastening structure for a heat-dissipating fan.

2. Description of the Related Art

Conventionally, heat-dissipating fins and a fan are provided on CPUs or GPUs to exhaust undesired heat buildup. FIG. 1 depicts an exploded view of a conventional fan fastening to a cover. A fan 100 and holes (not shown) of a cover 200 are aligned by axles A. Screws 300 are inserted though the fan and the holes along the axles A to connect the fan 100 and the cover 200. However, since screws must be used, costs are increased, and tools such as screwdrivers must be used in disassembly and reassembly. Further, repeated use can fatigue threading of the screws and weaken fastening.

FIG. 2 depicts another conventional assembly of the fan 100 and another cover 210 comprising at least one engaging portion 310. No screws are used in the assemblage since the fan 100 can connect to the cover 210 by the engaging portions 310. However, the intensity of the connection between the engaging portions and the outer frame of the fan is unstable. If a gap appears between the engaging portions and the outer frame of the fan, noise is produced during operation of the fan 100. If the connection between the engaging portions and the outer frame of the fan is overly tight, the engaging portions are easily broken.

BRIEF SUMMARY OF THE INVENTION

The invention provides a fastening structure. The fastening structure includes a frame corresponding to the periphery of an outer frame of a fan. That is, the fastening structure is corresponding to right-angle portions of the outer frame of the fan. The fastening structure includes a plurality of fastening members and two of the fastening members corresponding to each right-angle portion, respectively. Each fastening member includes a vertical portion fixed to the frame. An extending portion is disposed on the end of the vertical portion and is extending towards the interior of the frame. The extending portion includes a protrusion, and the distance between the extending portion and the frame substantially equals the thickness of the outer frame. The protrusion protrudes toward the frame. When the fan is assembled with the fastening structure, the fan attaches to the fastening structure by positioning the right-angle portions of the rectangular outer frame between the two fastening members. The fan is then rotated along an axle thereof to closely fit the protrusions in the holes of the outer frame so that the fan can be fixed on the frame of the fastening structure.

The fastening structure is applied on a fan which includes a rectangular outer frame. Moreover, each right-angle portion of the rectangular outer frame includes the hole.

The frame is connected with a cover, with which the frame is formed as a monolithic piece. The cover can also be connected with the heat-dissipating fins or the motherboard by various conventional ways.

The frame is connected with an air-guiding cover, with which the frame is formed as a monolithic piece.

The invention provides a method for fastening a fan and a cover. The fan comprises a rectangular outer frame. Each right-angle portion of the outer frame includes a hole. The fastening structure includes a frame and a plurality fastening members, and two of the fastening members corresponding to each right-angle portion, respectively. Each fastening member includes a vertical portion fixed to the frame. An extending portion is disposed on the end of the vertical portion and is extending towards the interior of the frame. The extending portion includes a protrusion, and the distance between the protrusion and the frame substantially equals the thickness of the outer frame. The protrusion protrudes toward the frame. The method includes the steps of attaching the fan to the fastening structure, positioning one of the right-angle portion of the rectangular outer frame between the two corresponding fastening members; rotating the fan along an axle thereof; fitting the protrusions closely in the holes of the outer frame; and fixing the fan on the frame of the fastening structure.

The method is not limited to the fan fastening to the cover. An air-guiding cover can also be fastened with the fan.

Thus, the fan can be fastened to the air-guiding cover or the cover by the fastening member. When attaching or detaching the fan, there is no additional tool needed to help the assemblage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

A fastening structure is provided.

Figure 1:
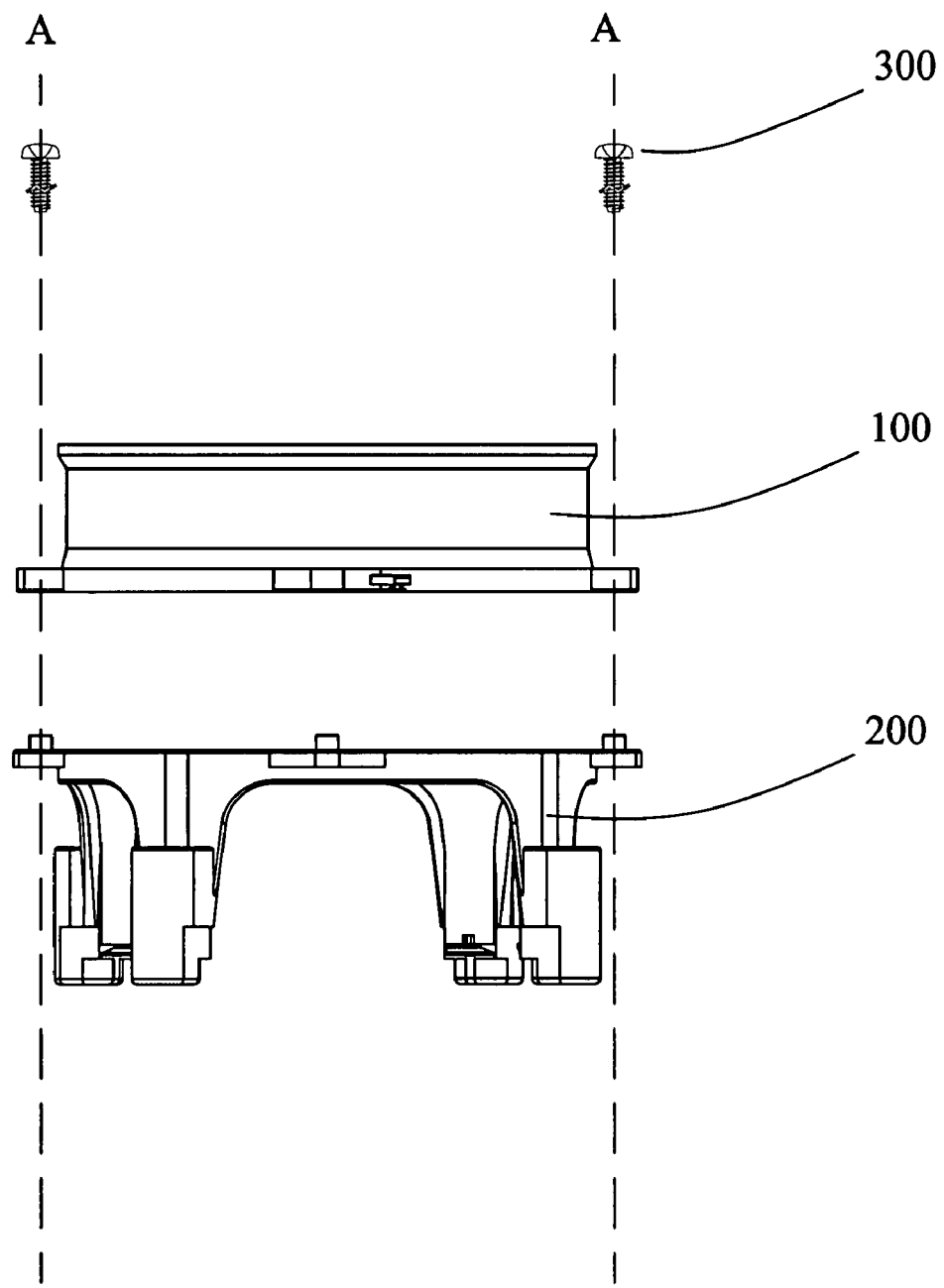
FIG. 1 is an exploded view of a conventional fan fastening to a cover.
Figure 2:
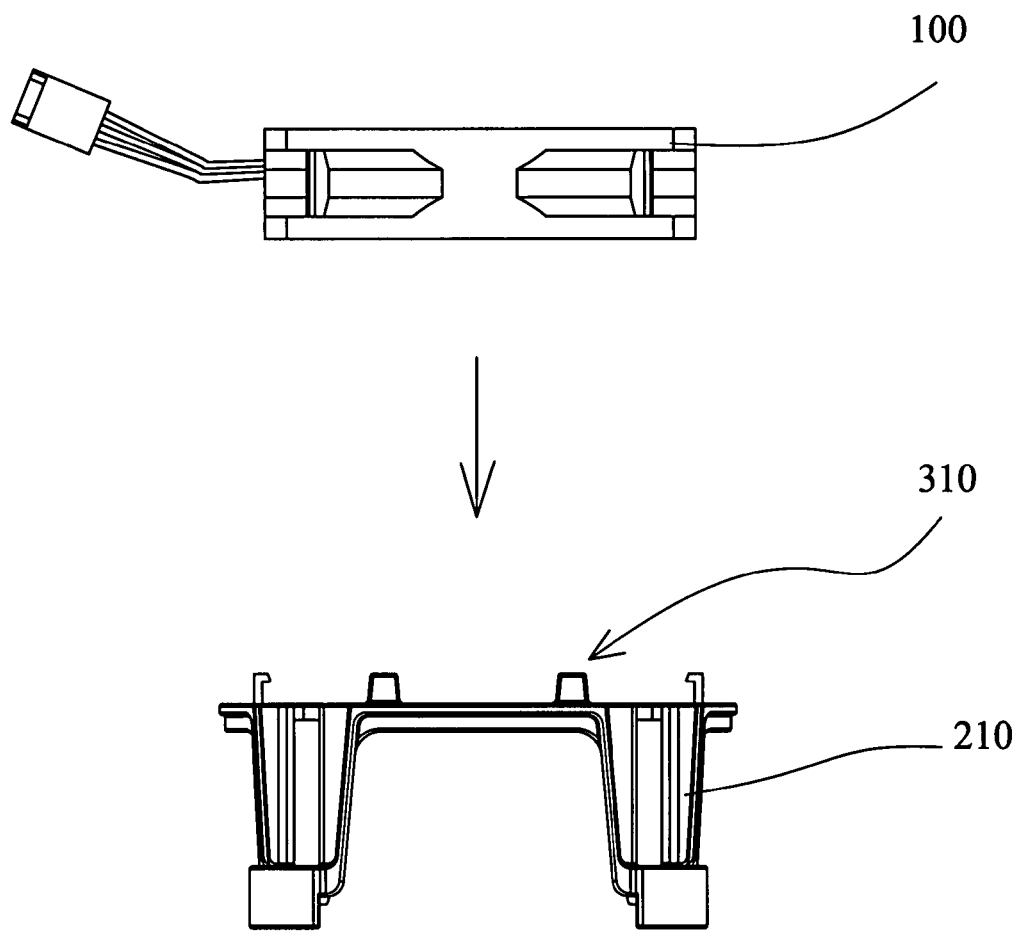
FIG. 2 is an exploded view of a conventional fan assembling to another cover.
Figure 3A:
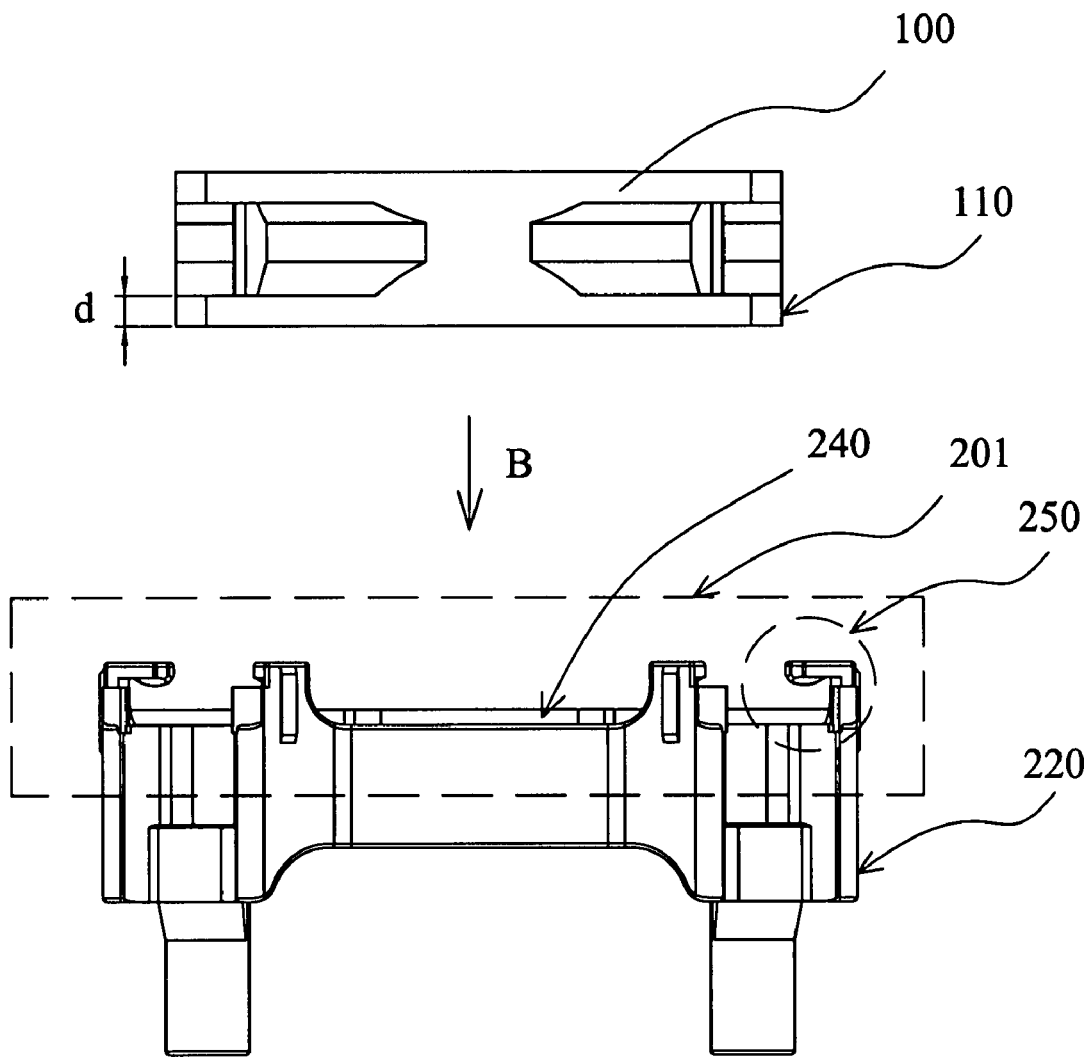
FIG. 3A is a side view of a fan and a fastening structure before assembling.
Figure 3B:
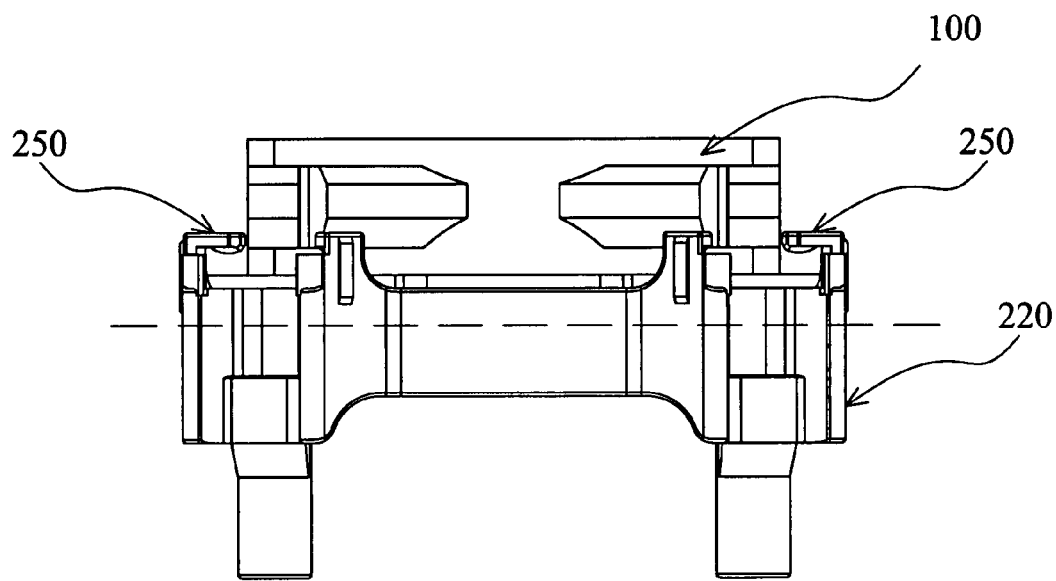
FIG. 3B is a side view of a fan attached to the fastening structure.

FIG. 3A depicts a side elevation of a fastening structure 201 fastened to a fan 100. The fastening structure 201 includes a frame as the dotted line indicated. The fastening structure 201 also includes at least one fastening member 250. The frame 240 and the cover 220 are formed as a monolithic piece. An outer frame 110 of the fan 100 has a thickness of d. The fan is attached to the fastening structure 201 in a direction B. FIG. 3B depicts a side view of the fan 100 attached to the fastening structure 201.

Figure 3C:
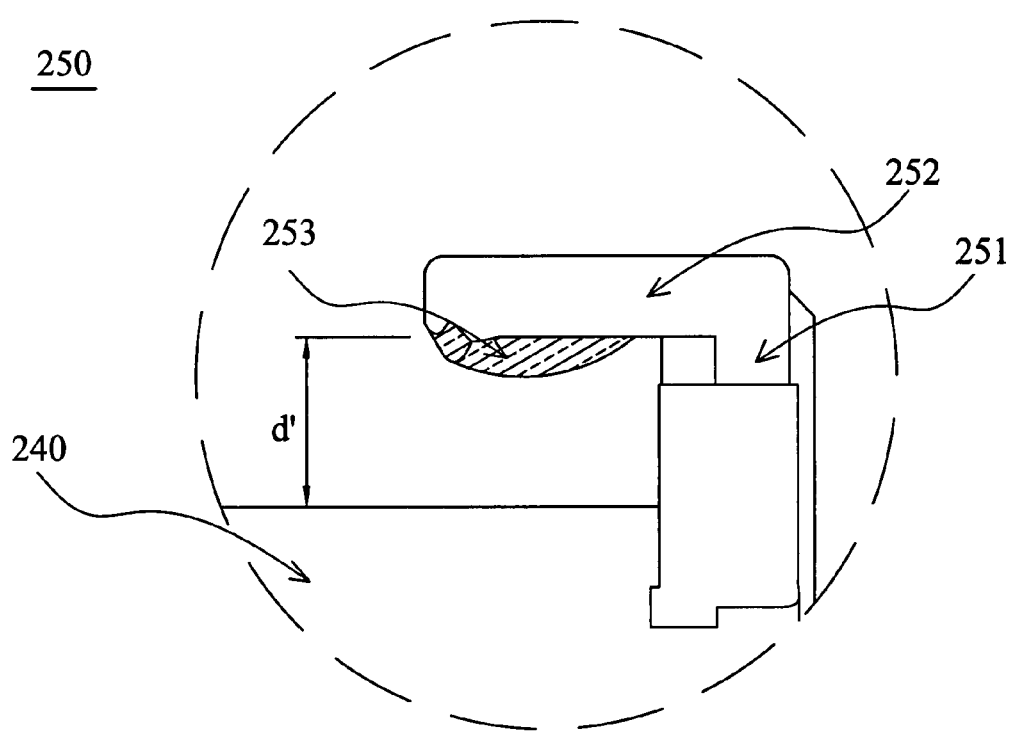
FIG. 3C is an enlarged view of a fastening member of the fastening structure shown in FIG. 3A.

FIG. 3C depicts an enlarged view of the fastening member 250. The fastening member 250 includes a vertical portion 251 fixed to the frame 240. An extending portion 252 is disposed on the end of the vertical portion 251. The extending portion 252 substantially extends towards the center of the frame 240. A protrusion 253 is disposed on the extending portion 252 and extends towards the frame 240. The distance d' between the extending portion 252 and the frame 240 substantially equals the thickness d of the outer frame 110.

Figure 4:
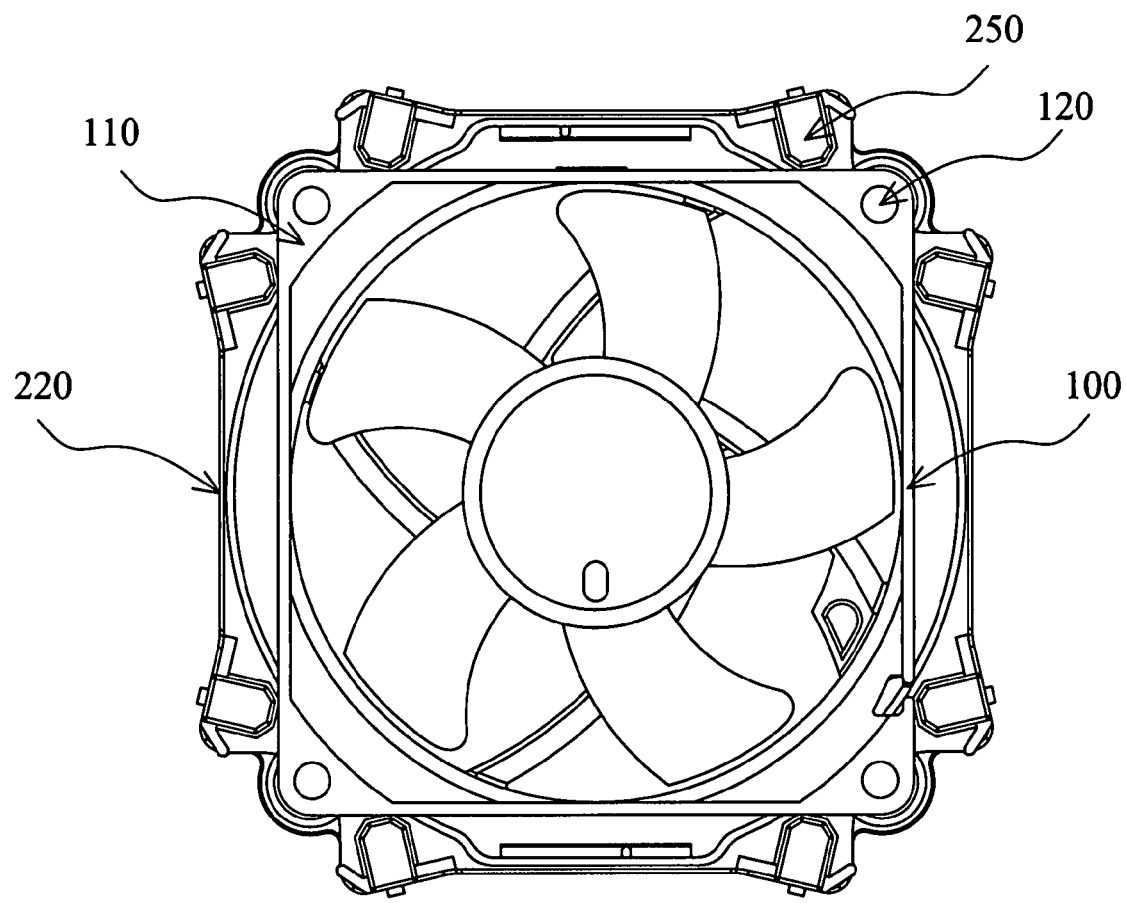
FIG. 4 is a top view of a fan attached to the fastening structure.

FIG. 4 is a top view of the fan 100 attached to the fastening structure 201, i.e., a top view of FIG. 3B. Each right-angle portion of the rectangular outer frame 110 of the fan 100 comprises a hole 120. The fastening members 250 are on two sides of each right-angle portion.

Figure 5:
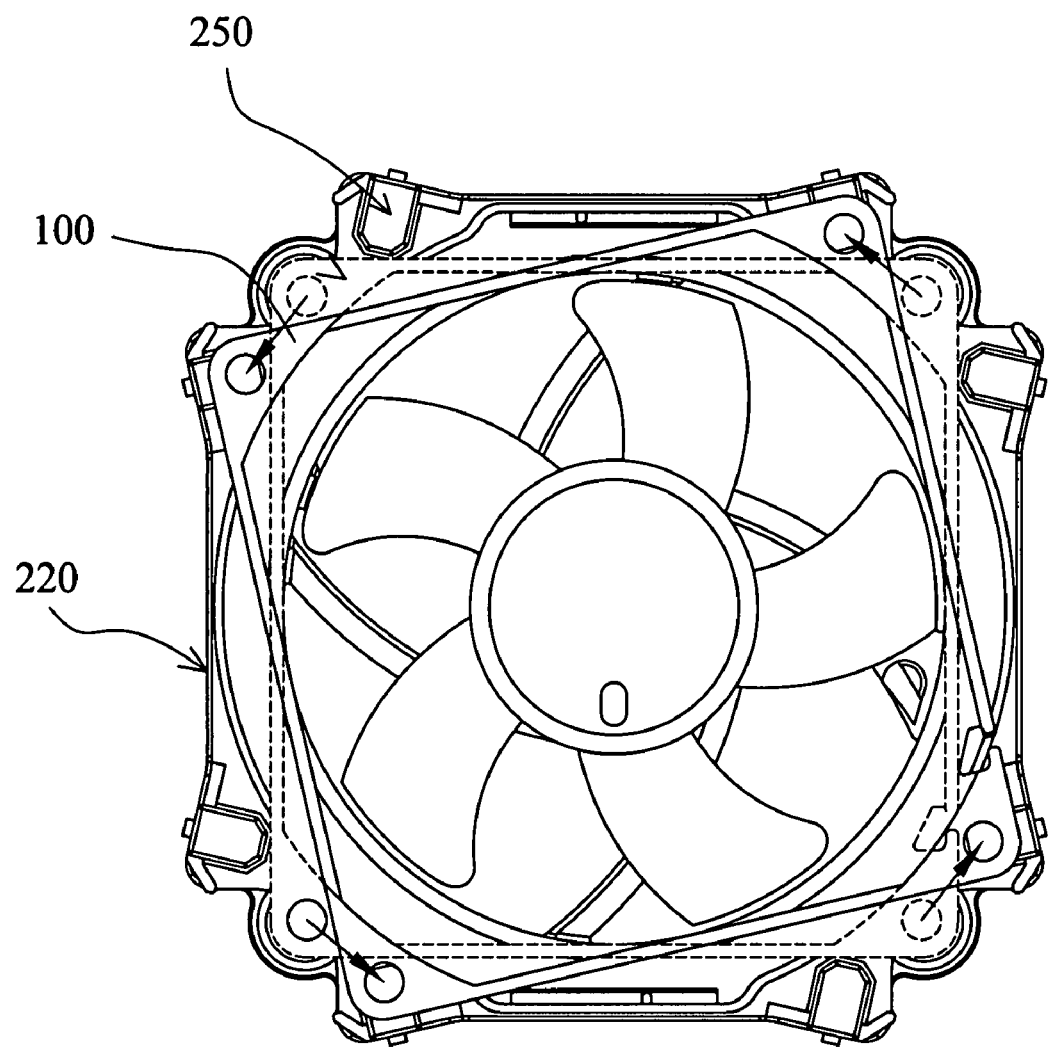
FIG. 5 is a top view of a fan fastening to the fastening structure.

FIG. 5 is a top view of the fan 100 fastening to the fastening structure 201. After attaching the fan 100 to the fastening structure 201 as shown in FIG. 45 the fan 100 is rotated along an axle of the fan 100 clockwise or counterclockwise. Because the distance d' between the extending portion 252 of the fastening member 250 and the frame 240 equals the thickness d of the outer frame 110, the outer frame 110 of the fan 100 can slide to be disposed between the extending portion 252 and the frame 240. The protrusions 253 fit closely in the holes 120 of the fan 100 so that the fan 100 can be fixed on the fastening structure 201. The protrusions 253 remain in the holes 120 of the fan 100 for a close fit. In this embodiment, the fan 100 can be rotated around the axle clockwise or counterclockwise to fit the protrusions 253 closely in the holes 120 of the fan 100 and to fasten the fan on the fastening structure.

While, here, a fastening structure having a cover is disclosed, the cover, the fastening member and the frame can alternatively be connected by adhesion or close fit, or formed as a monolithic piece. The frame can further be connected to an air-guiding cover by adhesion, close fit or they can be formed as a monolithic piece so that a conventional fan can be fastened to the air-guiding cover. The cover and the air-guiding cover can be made of plastic.

Further, while the outer frame of the fan as disclosed is rectangular, it is not limited thereto as long as the outer frame includes a hole into which a protrusion of the fastening structure can be closely fitted.

The fastening structure includes at least one fastening member corresponding to each right-angle portion, located on any side of the right-angle portion, but the number of the fastening member is not limited as long as the fastening member can fit closely in the hole.

By the fastening structure, the fan can be fastened to the cover or the air-guiding cover. To disassemble the fan, a rotation on the fan in an opposite direction to the assembly direction easily separates the fan and the fastening structure.

The fastening structure of the embodiment is applicable with any commercially available fan, and provides easier assembly. Additionally, robust connectivity between fan and fastening structure provides full compliance with shock and vibration testing requirements.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fastening structure adapted to be used with a fan, comprising:
   a frame comprising at least one right-angle portion; and
   a plurality of fastening members, each of the fastening members comprising a vertical portion fixed to the frame, and an extending portion extending towards the interior of the frame and comprising a protrusion,
   wherein the fan is not perfectly aligned with the protrusion by an angle so that the protrusion is fitted into a hole of the outer frame of the fan by rotating the fan, wherein the fastening members are on two sides of the right-angle portion.

2. The fastening structure as claimed in claim 1, wherein the distance between the extending portion and the frame substantially equals the thickness of the outer frame of the fan, and the protrusion protrudes toward the frame.

3. The fastening structure as claimed in claim 1 further comprising a cover, wherein the frame is adhered or closely fitted to the cover.

4. The fastening structure as claimed in claim 3, wherein the cover is plastic.

5. The fastening structure as claimed in claim 3, wherein the frame, the fastening member and the cover are connected and formed as a monolithic piece.

6. The fastening structure as claimed in claim 1 further comprising an air-guiding cover, wherein the frame is adhered or closely fitted to the air-guiding cover.

7. The fastening structure as claimed in claim 6, wherein the air-guiding cover is plastic.

8. The fastening structure as claimed in claim 6, wherein the frame, the fastening member and the air-guiding cover are connected and formed as a monolithic piece.

9. A fan assembly comprising:
   a fan comprising an outer frame which has at least one hole;
   a frame comprising at least one right-angle portion; and
   a plurality of fastening members, wherein each of the fastening members comprises a vertical portion fixed to the frame; and an extending portion extending toward the interior of the frame and comprising a protrusion;
   wherein the fan is not perfectly aligned with the protrusion by an angle so that the protrusion is fitted into a hole of the outer frame of the fan by rotating the fan, wherein the fastening members are on two sides of the right-angle portion.

10. The fan assembly as claimed in claim 9, wherein the outer frame of the fan is rectangular, and the periphery of the outer frame has the hole.

11. The fan assembly as claimed in claim 9, wherein the distance between the extending portion and the frame substantially equals the thickness of the outer frame of the fan, and the protrusion protrudes toward the frame.

12. The fan assembly as claimed in claim 9 further comprising a cover, wherein the frame is adhered or closely fitted to the cover.

13. The fan assembly as claimed in claim 12, wherein the cover is plastic.

14. The fan assembly as claimed in claim 12, wherein the-frame, the fastening member and the cover are connected and formed as a monolithic piece.

15. The fan assembly as claimed in claim 9 further comprising an air-guiding cover, wherein the frame is adhered or closely fitted to the air-guiding cover.

16. The fan assembly as claimed in claim 15, wherein the air-guiding cover is plastic.

17. The fan assembly as claimed in claim 15, wherein the frame, the fastening member and the air-guiding cover are connected and formed as a monolithic piece.

18. The fan assembly as claimed in claim 9, wherein the frame is a cover or an air-guiding cover.

19. A fan assembly method comprising:
   providing a fan, wherein the fan comprises an outer frame which has at least one hole;
   providing a frame, wherein the frame has a contact surface, and the fan contacts the frame with the contact surface;
   providing a plurality of fastening members, wherein each of the fastening members comprises a vertical portion fixed to the frame; and an extending portion extending toward the interior of the frame and comprising a protrusion;
   fitting the protrusion into a hole of the outer frame of the fan by rotating the fan on the contact surface of the frame, wherein the fan is not perfectly aligned with the protrusion by an angle before fitting.

* * * * *